United States Patent
Kumamoto et al.

[11] Patent Number: 5,138,437
[45] Date of Patent: Aug. 11, 1992

[54] SEMICONDUCTOR INTEGRATED CIRCUIT DEVICE IN WHICH INTEGRATED CIRCUIT UNITS HAVING DIFFERENT FUNCTIONS ARE STACKED IN THREE DIMENSIONAL MANNER

[75] Inventors: Toshio Kumamoto; Shinichi Nakagawa; Masao Nakaya, all of Hyogo, Japan

[73] Assignee: Mitsubishi Denki Kabushiki Kaisha, Tokyo, Japan

[21] Appl. No.: 587,501

[22] Filed: Sep. 24, 1990

Related U.S. Application Data

[63] Continuation of Ser. No. 224,412, Jul. 26, 1988, abandoned.

[30] Foreign Application Priority Data

Jul. 27, 1987 [JP] Japan ................... 62-187960

[51] Int. Cl.$^5$ ............... H01L 23/16; H01L 23/48; H01L 29/44; H01L 29/52
[52] U.S. Cl. ......................... 357/75; 357/71; 357/74; 361/393; 361/420; 439/69; 439/74
[58] Field of Search ................ 357/75, 71, 54, 80, 357/74; 361/393, 420; 439/69, 74

[56] References Cited

U.S. PATENT DOCUMENTS

| 4,074,342 | 2/1978 | Honn et al. | 361/411 |
| 4,122,479 | 10/1978 | Sugawara et al. | 357/19 |
| 4,288,841 | 9/1981 | Gogal | 361/414 |
| 4,371,912 | 2/1983 | Guzik | 361/417 |
| 4,446,478 | 5/1984 | Bacuvier | 357/75 |
| 4,888,631 | 12/1989 | Azuma et al. | 357/23.6 |

OTHER PUBLICATIONS

Proceedings of the IEEE: "Three-Dimensional IC Trands" by Y. Akasaka, vol. 74, No. 12, Dec. 1982, pp. 1703-1714.

Primary Examiner—Rolf Hille
Assistant Examiner—David Ostrowski
Attorney, Agent, or Firm—Lowe, Price, LeBlanc & Becker

[57] ABSTRACT

A semiconductor integrated circuit device comprises a general purpose unit having a general purpose function and a specific unit for a specific use of the semiconductor integrated circuit device. In addition, the semiconductor integrated circuit device has structure in which a plurality of layers each having an integrated circuit formed therein are stacked in a three-dimensional manner. Specific unit layers are formed on the surface of the layer having the general purpose unit formed therein by different manufacturing processes.

3 Claims, 3 Drawing Sheets

SEMICONDUCTOR INTEGRATED CIRCUIT DEVICE IN WHICH INTEGRATED CIRCUIT UNITS HAVING DIFFERENT FUNCTIONS ARE STACKED IN THREE DIMENSIONAL MANNER

This application is a Continuation; application of application Ser. No. 224,412, filed Jul. 26, 1988 now abandoned.

BACKGROUND OF THE INVENTION

1. Field of the Invention

The present invention relates generally to semiconductor integrated circuit devices, and more particularly, to structure of a large scale integrated circuit device comprising a general purpose unit and a specific unit or custom unit and used for a specific purpose.

2. Description of the Prior Art

A semiconductor integrated circuit device has been known which is adapted to perform a specific function in accordance with the requirements of users or the requirements of an equipment and an apparatus to be mounted. FIG. 4 shows diagrammatically structure of such a conventional semiconductor integrated circuit device. This semiconductor integrated circuit device is referred to as a mixed LSI hereinafter. In FIG. 4, a general purpose unit WU and a specific unit SU are formed on a semiconductor substrate 1. The general purpose unit WU is structured by an integrated circuit such as a general purpose memory and a microprocessor, and the circuit operation thereof has versatility which can be generally applied to many other equipment and apparatuses by performing a standard operation. The specific unit SU is structured by an auxiliary circuit for allowing coincidence between an operational function of the integrated circuit constituting the general purpose unit WU and an operational function required for the LSI, and the circuit operation thereof is specified every specification of the LSI. In addition, bonding pads BP are provided on the semiconductor substrate 1 to surround the general purpose unit WU and the specific unit SU. The bonding pads BP are connected to a lead frame (not shown) by wires such as gold lines when the LSI is packaged. In an operation of the conventional mixed LSI, the general purpose unit WU and the specific unit SU function by receiving and sending signals from and to the exterior through the bonding pads, the wires and the lead frame. As described above, the conventional mixed LSI has two-dimensional device structure. Thus, as a function performed by a single mixed LSI increases in accordance with the requirement of a higher degree of function, the area of a chip increases. As one method for controlling the increase in the area of the chip and increasing the function, it is considered that structure of the mixed LSI comprises three-dimensional stacked structure. For example, this consideration is illustrated in a three-dimensional device such as an SRAM (Static Random Access Memory) and a photosensor which is described in an article by Yoichi Akasaka entitled "Three-Dimensional IC Trends" PROCEEDINGS OF THE IEEE December 1986 pp. 1703- 1714. The SRAM has two-layer stacked structure in which a memory cell portion is formed in a first layer and a peripheral circuit portion such as a sense amplifier and a decoder is formed in a second layer. In addition, the photosensor has three-layer stacked structure in which a select logic circuit portion is formed in a first layer, a digitizer is formed in a second layer and a photodetector is formed in a third layer. Each of the three-dimensional devices is divided every device blocks which does not perform a significant function by itself and has a relatively low function and the divided device blocks are stacked.

However, if such stacked structure is applied to the mixed LSI, the manufacturing processes become complicated, so that the manufacturing period becomes long. More specifically, in order to manufacture the mixed LSI having stacked structure, many processes such as growth of a crystal layer, patterning and wiring are required every layer. Consequently, the number of processes is increased as compared with the conventional mixed LSI having two-dimensional structure, and techniques peculiar to the stacked structure such as a planar technique and an SOI (Silicon on Insulator) forming technique are required, so that the processes become complicated. As a result, the manufacturing period becomes long. Originally, such a mixed LSI tends to be a product which differs depending on users, to be many kinds and small amounts of ordered products. Thus, the date of delivery of the product is an important factor. Consequently, the manufacturing period is unfavorably extended in place of high integration density achieved by making the product to have stacked structure.

SUMMARY OF THE INVENTION

Therefore, an object of the present invention is to improve the integration degree of a semiconductor integrated circuit device and the manufacturing period thereof.

Another object of the present invention is to simplify the manufacturing process of stacked structure of a semiconductor integrated circuit device.

The semiconductor integrated circuit device according to the present invention has structure in which a general purpose unit and a specific unit constituting the device are formed on independent layers and stacked.

According to the present invention, even if the requirements of users for the semiconductor integrated circuit device are various in kind, only the general purpose unit layer can be efficiently manufactured in the same manufacturing processes. In particular, when the general purpose unit is formed in a first layer, the general purpose unit can be manufactured as standard parts before an order. In addition, the specific unit layer is structured by a gate array, so that the stacked structure in which the general purpose unit is formed in a first layer and the specific unit structured by the gate array is formed in a second layer can be manufactured as standard parts. Such structure allows the manufacturing period to be shortened. Furthermore, structure of a general purpose semiconductor device currently being manufactured can be applied to the general purpose unit in the first layer, and wiring for connecting the general purpose unit in the first layer to the specific unit formed in the second layer can be performed through bonding pads of the general purpose semiconductor device applied to the first layer. Consequently, the design process of the general purpose unit can be further omitted, so that the manufacturing period can be shortened.

These objects and other objects, features, aspects and advantages of the present invention will become more apparent from the following detailed description of the present invention when taken in conjunction with the accompanying drawings.

Meanwhile, the same reference numerals, denote the same or corresponding portions.

DESCRIPTION OF THE PREFERRED EMBODIMENTS

Figure 1:
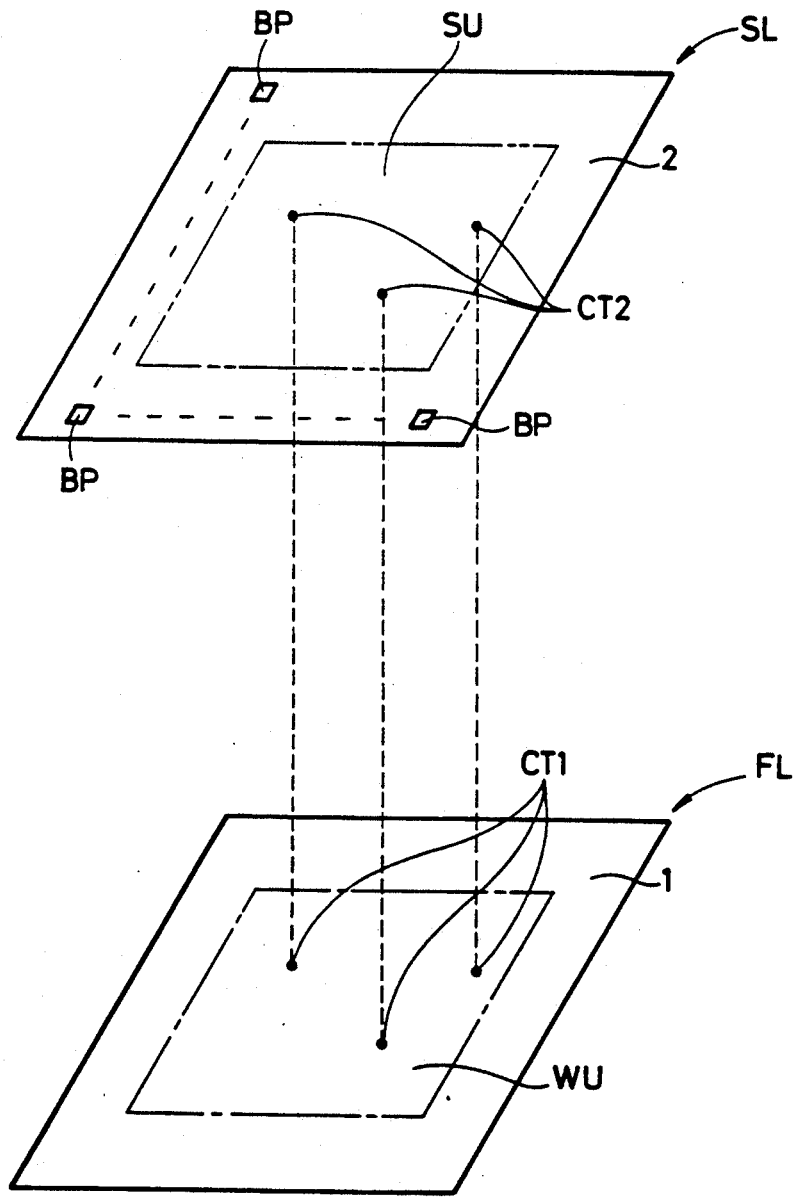
FIG. 1 is an exploded schematic diagram showing structure of a semiconductor integrated circuit device according to an embodiment of the present invention.

FIG. 1 is an exploded schematic diagram showing structure of a semiconductor integrated circuit device according to a first embodiment of the present invention. The semiconductor integrated circuit device has two-layer stacked structure. A general purpose unit WU comprised of an integrated circuit such as a general purpose memory and a general purpose microprocessor is formed in a substantially central portion of a p type semiconductor substrate 1 in a first layer FL. A second layer SL is stacked on the surface of the first layer FL through an interlayer insulating film 2. A specific unit SU comprised of an integrated circuit having a logic function, a memory function or the like is formed in a central portion of the second layer SL. In addition, bonding pads BP are provided in the vicinity of the specific unit SU to surround the specific unit SU. In the specific unit SU and the general purpose unit WU, nodes CT1 and CT2 are formed in predetermined positions. Both the nodes are connected to each other, so that the specific unit SU and the general purpose unit WU are electrically connected.

Figure 2:
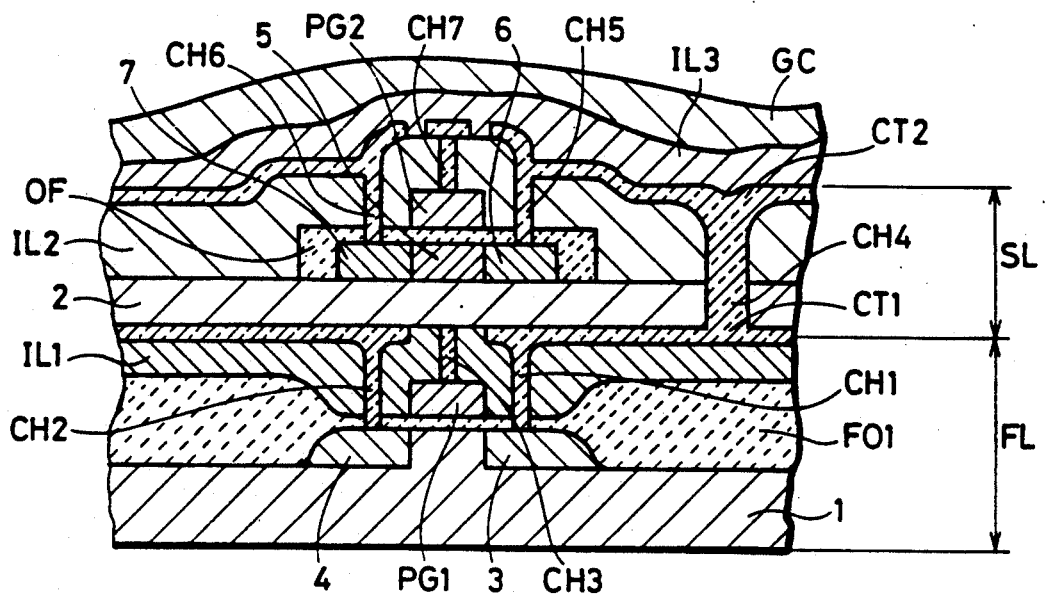
FIG. 2 is a cross sectional view showing stacked cross-sectional structure of the semiconductor integrated circuit device shown in FIG. 1.

FIG. 2 is a diagram showing more specifically the stacked cross-sectional structure of the semiconductor integrated circuit device shown in FIG. 1. In FIG. 2, there is shown a partial cross section of the semiconductor integrated circuit device formed by stacking a transistor device constituting the general purpose unit WU and a transistor device constituting the specific unit SU.

n+ diffusion regions 3 and 4 for forming a source or a drain are formed on the surface of a p type semiconductor substrate 1. A gate electrode PG1 formed of polysilicon (polycrystalline silicon) is formed on the surface of the p type semiconductor substrate 1 sandwiched between the n+ diffusion regions 3 and 4 through a gate oxide film. The gate electrode PG1 and the n+ diffusion regions 3 and 4 constitute an N channel transistor device of the general purpose unit WU. The n+ diffusion regions 3 and 4 of the transistor device are connected to other transistor devices through contact holes CH1 and CH2, respectively. In addition, the gate electrode PG1 is connected to the other transistor devices through a contact hole CH3. Furthermore, a field oxide film FO1 of large thickness is formed on the surface of the p type semiconductor substrate 1. The transistor devices are isolated from each other by the field oxide film FO1. Additionally, an insulating layer IL1 is formed on the surface of the first layer FL. The foregoing is structure of the first layer FL. A node CT1 is provided in a particular position on the first layer FL. An interlayer insulator 2 is stacked on the first layer FL except in a contact hole CH4 for electrically connecting the nodes CT1 and CT2. A P type semiconductor portion 5 and n+ diffusion portions 6 and 7 are formed spaced apart from each other by a constant region on the interlayer insulator 2 so as to form one transistor device constituting the specific unit SU. The regions are formed using, for example, an SOI growth technique for forming a monocrystalline silicon layer on an insulating layer. The n+ diffusion portions 6 and 7 are wired by metal through contact holes CH5 and CH6, respectively, to be electrically connected to other devices. An oxide film of is formed to cover the P type semiconductor portion 5 and the n+ diffusion portions 6 and 7 except in the contact holes CH5 and CH6. A polysilicon gate PG2 is stacked in the position corresponding to the P type semiconductor portion 5 on the oxide film OF. The polysilicon gate PG2 is wired by metal through a contact hole CH7, to be electrically connected to other devices. In addition, an insulator layer IL2 is stacked on the interlayer insulator 2, the oxide film OF and the polysilicon gate PG2 except in the contact holes CH5 to CH7. Consequently, an N channel transistor which is one device of the specific unit SU is formed. The foregoing is structure of a second layer SL. In addition, an insulator layer IL3 is stacked on the second layer SL. Furthermore, a glass coat GC for protecting the device is stacked.

As described in the foregoing, only the general purpose unit WU is formed in the first layer FL. In addition, if the node CT1 of the first layer FL and the second layer SL is standardly positioned, large amounts of parts of the first layer FL having the same structure can be manufactured in accordance with the same process steps. The second layer SL having the above described specific unit SU is provided on the first layer FL, so that a semiconductor integrated circuit device (mixed LSI) used for a specific purpose can be manufactured. Thus, a layer having the general purpose unit provided therein and a layer having the specific unit provided therein are separated to form the mixed LSI, so that only at least the general purpose unit can be efficiently manufactured in the same manufacturing process even if the mixed LSI is various in kind, whereby the manufacturing period can be shortened.

Figure 3:
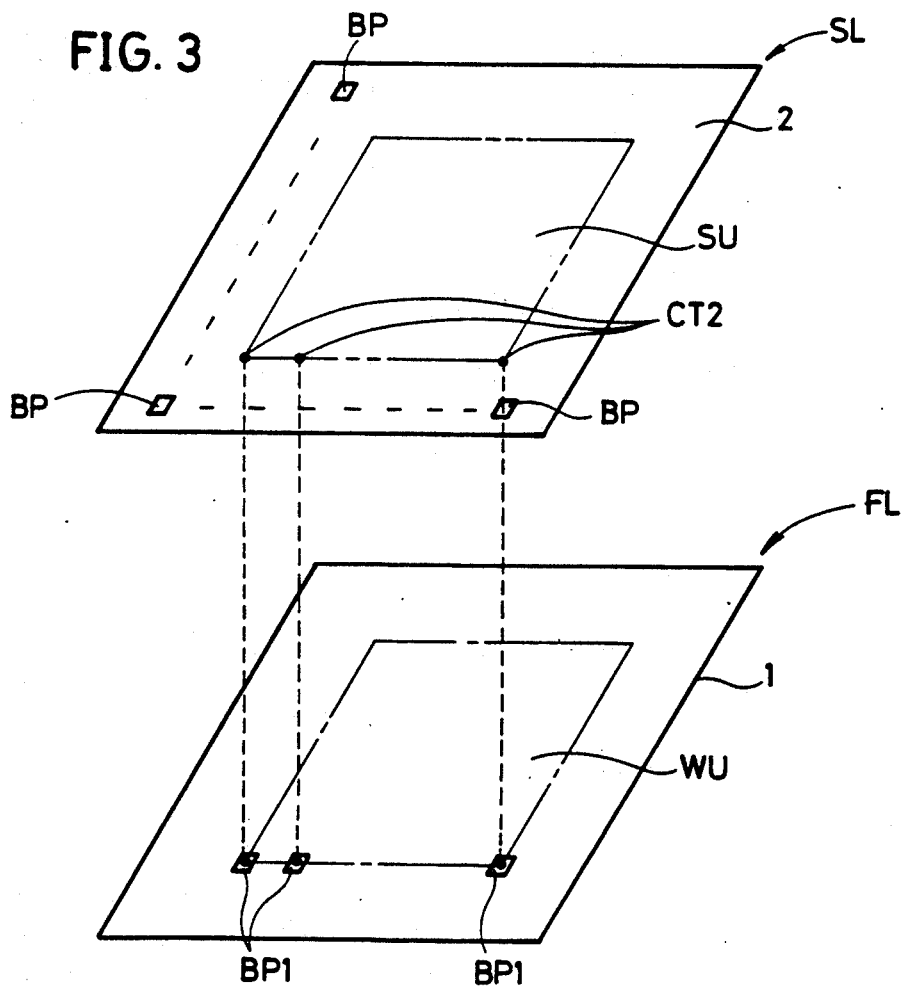
FIG. 3 is an exploded schematic diagram showing structure of a semiconductor integrated circuit device according to another embodiment of the present invention.
Figure 4:
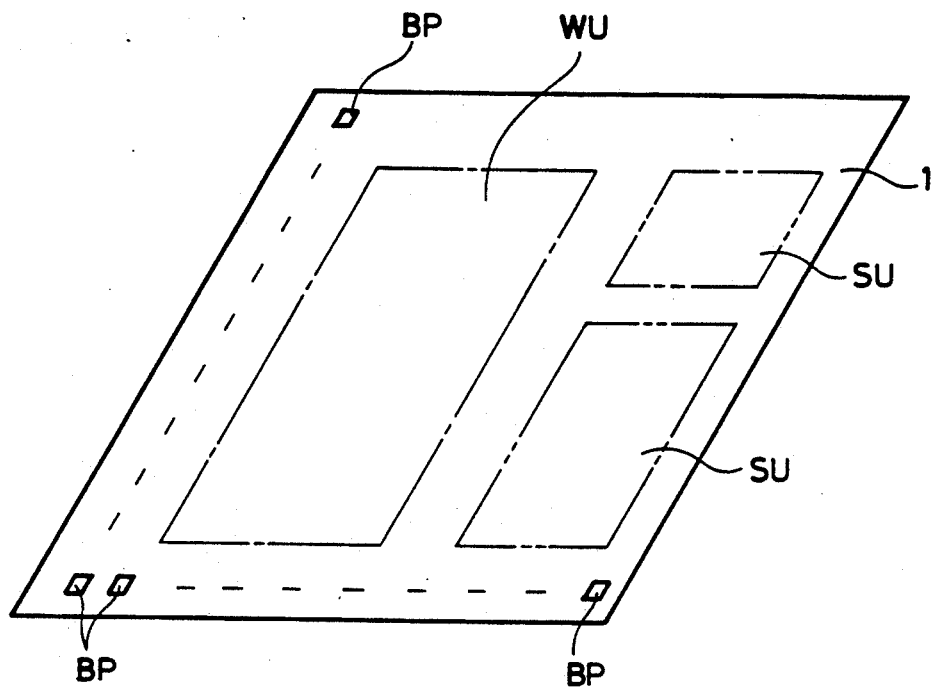
FIG. 4 is an exploded schematic diagram showing structure of a conventional semiconductor integrated circuit device.

FIG. 3 is a diagram showing another embodiment of the present invention. In FIG. 3, a first layer FL is a chip such as a conventional ready-made general purpose memory, in which bonding pads BP1 specific to a general purpose unit WU are provided to surround the general purpose unit WU. Furthermore, in a second layer SL, nodes CT2 are provided in the positions corresponding to the above described bonding pads BP1. The nodes CT2 and the bonding pads BP1 are electrically connected, so that the general purpose unit WU in the first layer FL and a specific unit SU in the second layer SL are electrically connected.

Since the first layer FL is structured by the chip of the conventional ready-made general purpose memory or the like as described above, the conventional process step for forming the first layer FL can be utilized without any modification, so that the process step for forming the first layer FL as shown in FIG. 1 need not be newly designed.

Furthermore, as still another embodiment, the specific unit SU may be structured by a gate array. If the gate array structure is employed, the steps until the step of forming the gate array can be standardized in the manufacturing processes of the specific unit SU. Thus, after the requirement from a user, the gate array is only wired in accordance with a specification desired by the user, so that a specialized semiconductor integrated circuit device can be manufactured.

As described in the foregoing, according to the present invention, in a semiconductor integrated circuit device in which devices are stacked in a three-dimensional manner to increase integration density, a general purpose unit having a general purpose function and formed in standardized manufacturing processes and a specific unit having a function specific to various semiconductor integrated circuit devices and formed in manufacturing processes corresponding to the specific function are separately formed on different layers. Consequently, the manufacturing processes of the general purpose unit are standardized and simplified, so that manufacturing processes of the semiconductor integrated circuit device can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising a stacked structure formed on a single substrate including a lower layer and an upper layer on said single substrate and separated from each other by an insulation layer, said lower layer comprising a general purpose integrated circuit having a user invariable circuit structure, said upper layer comprising an integrated circuit having a user variable circuit structure, wherein any user variable circuit structure is only comprised by said upper layer, said lower layer and said upper layer including connection nodes at predetermined corresponding locations, said insulation layer including holes at predetermined locations corresponding to said connection nodes, and means for electrically connecting corresponding connection nodes respectively of said lower layer and said upper layer through said corresponding holes in said insulation layer, wherein said upper layer includes a structured gate array.

2. A semiconductor integrated circuit device comprising a stacked structure formed on a single substrate including a lower layer and an upper layer on said single substrate and separated from each other by an insulation layer, said lower layer comprising a general purpose integrated circuit having a user invariable circuit structure, said upper layer comprising an integrated circuit having a user variable circuit structure, wherein any user variable circuit structure is only comprised by said upper layer, said lower layer and said upper layer including connection nodes at predetermined corresponding location, said insulation layer including holes at predetermined locations corresponding to said connection nodes, and means for electrically connecting corresponding connection nodes respectively of said lower layer and said upper layer through said corresponding holes in said insulation layer, wherein said lower layer and said upper layer are electrically connected through bonding pads provided in the lower layer.

3. The semiconductor integrated circuit device according to claim 1, wherein said lower layer and said upper layer are electrically connected through bonding pads provided in the first layer.

* * * * *